(12) United States Patent
Beer

(10) Patent No.: US 7,625,781 B2
(45) Date of Patent: Dec. 1, 2009

(54) SEMICONDUCTOR DEVICE HAVING A PLASTIC HOUSING AND EXTERNAL CONNECTIONS AND METHOD FOR PRODUCING THE SAME

(75) Inventor: Gottfried Beer, Nittendorf (DE)

(73) Assignee: Infineon Technologies AG, Munich, DE (US)

( * ) Notice: Subject to any disclaimer, the term of this patent is extended or adjusted under 35 U.S.C. 154(b) by 417 days.

(21) Appl. No.: 11/354,391

(22) Filed: Feb. 15, 2006

(65) Prior Publication Data

US 2006/0197220 A1  Sep. 7, 2006

(30) Foreign Application Priority Data

Feb. 15, 2005  (DE) ........................ 10 2005 006 995

(51) Int. Cl.
*H01L 21/44* (2006.01)
(52) U.S. Cl. .................................................... 438/122
(58) Field of Classification Search ................. None
See application file for complete search history.

(56) References Cited

U.S. PATENT DOCUMENTS

| 5,734,270 | A | * | 3/1998 | Buchanan | 324/754 |
| 6,013,948 | A | | 1/2000 | Akram et al. | |
| 6,093,584 | A | | 7/2000 | Fjelstad | |
| 6,177,721 | B1 | | 1/2001 | Suh et al. | |
| 6,355,507 | B1 | * | 3/2002 | Fanworth | 438/127 |
| 6,618,267 | B1 | | 9/2003 | Dalal et al. | |
| 6,821,819 | B1 | * | 11/2004 | Benavides et al. | 438/122 |

| 2003/0030143 | A1 | 2/2003 | Wennemuth et al. |
| 2003/0151144 | A1 | 8/2003 | Muta et al. |
| 2004/0173892 | A1 | 9/2004 | Nakanishi |
| 2004/0183185 | A1 | 9/2004 | Badihi |

FOREIGN PATENT DOCUMENTS

| DE | 3326508 | 2/1985 |
| DE | 10137346 | 2/2003 |
| DE | 10138278 | 4/2003 |
| DE | 102004009056 | 9/2005 |
| JP | 04206858 | 7/1992 |
| KR | 2001009831 | 2/2001 |
| KR | 2001018381 | 3/2001 |
| WO | 2005/081316 | 9/2005 |

* cited by examiner

*Primary Examiner*—Charles D. Garber
*Assistant Examiner*—Andre' C Stevenson
(74) *Attorney, Agent, or Firm*—Dicke, Billig, Czaja PLLC

(57) ABSTRACT

A semiconductor device having a plastic housing and external connections, and to a method for producing the same is disclosed. In one embodiment, the plastic housing has a housing external contour made of plastic external areas with a top side, an underside opposite to the top side, and edge sides. Lower external contact areas are arranged on the underside and upper external contact areas are arranged on the top side. Furthermore, the plastic housing has external conductor tracks along the housing external contour, by means of which the lower and upper external contact areas are electrically connected. For this purpose, the external conductor tracks have at least one jet-printed first conductor track layer made of electrically conductive material. Such jet-printed conductor track layers may also be applied to active top sides of semiconductor chips in order to bridge underlying conductor track layers.

10 Claims, 5 Drawing Sheets

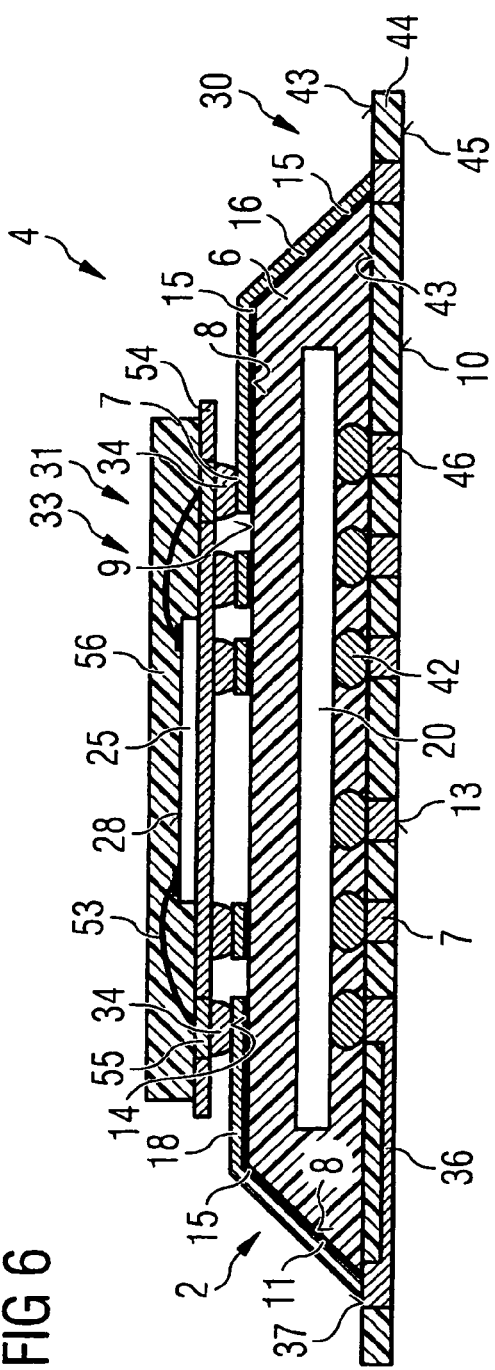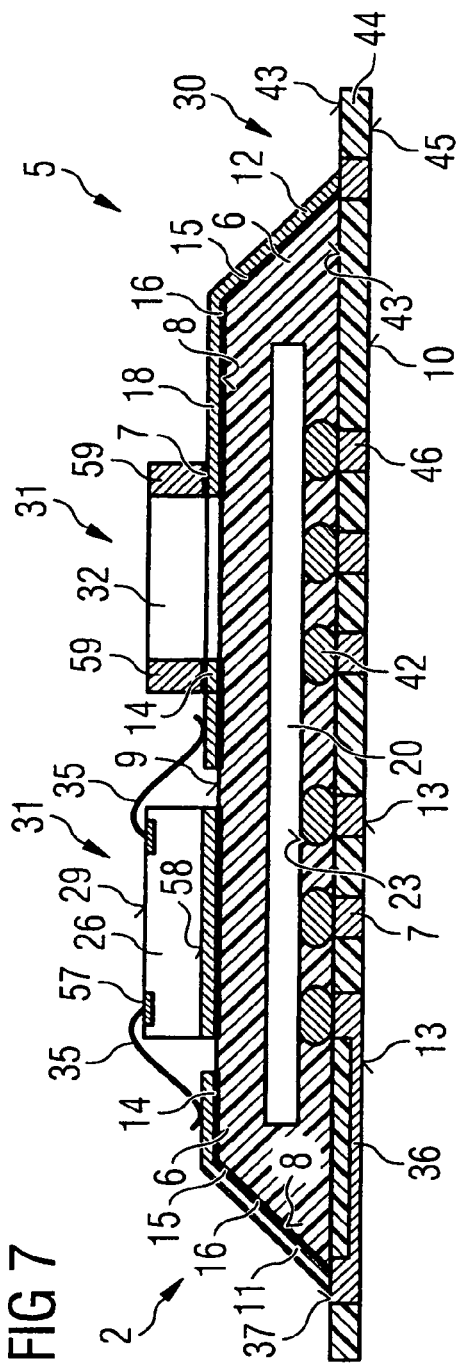

140 # SEMICONDUCTOR DEVICE HAVING A PLASTIC HOUSING AND EXTERNAL CONNECTIONS AND METHOD FOR PRODUCING THE SAME

CROSS-REFERENCE TO RELATED APPLICATIONS

This Utility Patent Application claims priority to German Patent Application No. DE 10 2005 006 995.9 filed on Feb. 15, 2005, which is incorporated herein by reference.

FIELD OF THE INVENTION

The invention relates to a semiconductor device having a plastic housing and external connections, and to a method for producing the same. In particular, the invention relates to a semiconductor module having at least one electronic device stacked on the semiconductor device. The semiconductor device has a housing having plastic external areas. Arranged on an underside of the housing there are external contact areas for fitting external contacts as external connections, and on a top side of the housing, opposite to the underside, there are external contact areas present as external connections for stacking at least one surface-mountable electronic device.

BACKGROUND

Conventional semiconductor devices such as are known from the document DE 101 38 278 are provided with additional flexible rewiring films for the stacking of surface-mountable BGA or LBGA housings (ball grid array or large ball grid array), said rewiring films having a larger area than the semiconductor devices to be stacked and projecting beyond the edge of the semiconductor devices, so that they can be bent in the direction of a semiconductor device of a semiconductor module that is arranged underneath and be electrically connected to the semiconductor device arranged underneath by means of the flexible film.

A semiconductor module having semiconductor devices stacked in this way has the disadvantage that the semiconductor devices cannot be stacked with the smallest possible space requirement, especially since the bent-away rewiring film also requires a bending radius that cannot be undershot without risking microcracks in the rewiring lines arranged on the rewiring film. Other conventional semiconductor devices have a rewiring substrate with external contacts arranged on the top side of the rewiring substrate, and, on the top side of the rewiring substrate, at least one semiconductor chip, for example a memory device such as a DRAM (dynamic random access memory), is arranged in the center of the rewiring substrate.

If a conventional semiconductor device of this type is intended to be used for a semiconductor module, then only the edge regions of the rewiring substrate may be available for fitting external contacts of an electronic device to be stacked, as is described in the patent application DE 10 2004 009 056. Since the center of the rewiring substrate is occupied by the semiconductor chip, the number and arrangement of external contacts of the electronic device to be stacked is greatly restricted, so that a large number of known housing types, such as BGA or LBGA housings, cannot be stacked on such a conventional semiconductor device with a rewiring substrate.

For these and other reasons, there is a need for the present invention.

SUMMARY

The present invention provides a semiconductor device and method of making a semiconductor device. In one embodiment, the semiconductor device includes a plastic housing and external connections. The plastic housing includes a housing external contour made of plastic external areas with a top side, an underside opposite to the top side, and edge sides, lower external contact areas being arranged on the underside and upper external contact areas being arranged on the top side. The plastic housing includes external conductor tracks along the housing external contour, by means of which the lower external contact areas are electrically connected to the upper external contact areas and/or to contact areas of a semiconductor chip, and the external conductor tracks comprising at least one jet-printed or liquid-applied first conductor track layer made of electrically conductive material.

BRIEF DESCRPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 6 illustrates a schematic cross section through a semiconductor module in accordance with a fourth embodiment of the invention.

FIG. 7 illustrates a schematic cross section through a semiconductor module in accordance with a fifth embodiment of the invention.

DETAILED DESCRIPTION

Figure 1:
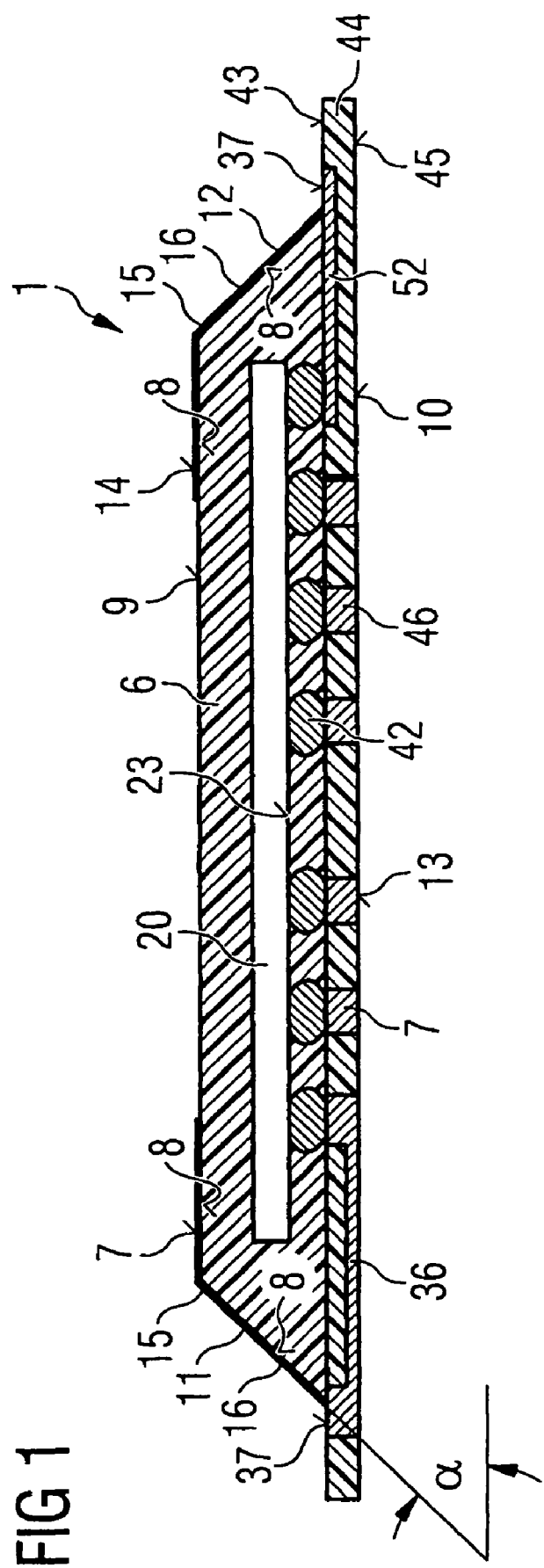
FIG. 1 illustrates a schematic cross section through a semiconductor device of a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention provides a semiconductor device having a wiring substrate and a method for producing the same which can be used as a semiconductor device for a semiconductor module. In one embodiment, the present invention provides a semiconductor device in which, on the top side, it is possible to provide an arbitrary arrangement for external contact areas or external connections and it is possible for external contact areas to be distributed independently thereof on the underside of the wiring substrate for a surface-mountable semiconductor device. The present invention minimizes the space requirement and the area requirement of a semiconductor device, in particular to decrease the space requirement of a memory module made of DRAM semiconductor devices with stacked passive electronic devices.

In one embodiment, the invention provides a semiconductor device including a plastic housing and external connections, the plastic housing including a housing external contour made of plastic external areas with a top side, an underside opposite to the top side, and edge sides. Lower external contact areas are arranged on the underside and upper external contact areas are arranged on the top side. The plastic housing includes external conductor tracks along the housing external contour. The upper external contact areas are electrically connected to the lower external contact areas by means of the external conductor tracks. Internal conductor tracks and internal connecting elements may also be involved in this electrical connection. According to the invention, the external conductor tracks have at least one jet-printed or liquid-applied first conductor track layer made of electrically conductive material.

A semiconductor device of this type has the advantage that it can be produced extremely cost-effectively, especially as the upper external contact areas with the jet-printed or liquid-applied first conductor track layer can be applied to the first external areas of the plastic housing of the semiconductor device. Furthermore, the semiconductor device has the advantage that the edge sides of the semiconductor device may also be equipped with said first conductor track layer, it being possible for the edge sides also to be arranged at right angles to the top side and underside of the semiconductor device.

This advantage can be achieved by using a pivotable jet printing nozzle that can follow the external contour of the housing during jet printing, so that the external conductor tracks can be printed in a first conductor track layer at different jet angles of the jet printing nozzle. In the case of a rigid jet nozzle head, it is advantageous if the edge sides are at an angle of inclination of $\alpha \leq 60°$ with respect to the underside of the semiconductor device in order to ensure a reliable writing or jet printing of external conductor tracks on the edge sides and the top side of the semiconductor device. Furthermore, it is also advantageously possible, in the case of a rigid jet nozzle head, to correspondingly pivot the semiconductor device in order, for example, to provide edge sides arranged perpendicular to the underside with conductor tracks.

In a further embodiment of the invention, one or a plurality of metal layers are arranged on the first jet-printed conductor track layer. This metal layer increases the conductivity of the conductor tracks or reduces the electrical resistance. Moreover, the material of the metal layer may be adapted to the requirements of the upper external contact areas. If, by way of example, a solder operation is provided for surface mounting of a surface-mountable electronic device, then the upper metal layer may have a solderable surface. If, on the other hand, bonding of a bonding wire as a connecting element is provided for the surface mounting of a surface-mountable electronic device on the top side of the semiconductor device, then a bondable metal may be applied as metal layer to the first jet-printed conductor track layer with external contact areas. In this context, bondable metal is understood to be a metal which forms, with a bonding wire alloy, a eutectic compound that melts at low temperature. Materials which preferably form intermetallic phases with the material of a connecting element of an electronic device to be stacked may also be arranged as an additional metal layer on the first jet-printed conductor track layer.

In a further embodiment of the invention, the lower external contact areas are connected to the upper external contact areas by a jet-printed through contact through the plastic of the housing. This embodiment of the invention has the advantage that wherever a semiconductor chip of the semiconductor device does not impede a passage through the plastic of the housing, it is possible to introduce further protected jet-printed through contacts. This introduction may be effected e.g., by means of a laser removal. The resulting passage opening from the top side of the semiconductor device to a wiring structure of a wiring substrate can become a through contact by filling the passage opening in the plastic with the aid of jet-printed conductive materials.

In a further embodiment of the invention, the semiconductor device comprises a semiconductor chip with jet-printed conductor tracks as an additional topmost wiring structure. Such an additional topmost wiring structure on the active top side of a semiconductor chip is advantageous when only a few additional conductor tracks are required in order preferably to realize bridges made of jet-printed conductor tracks on the active top side of the semiconductor chip. Such bridges may be-formed as "shunts" in order, by way of example, to activate, to deactivate, to branch and/or to connect function blocks of an integrated circuit that are provided after the production of the integrated circuit. Moreover, such bridges made of jet-printed conductor tracks on the semiconductor chip may serve to increase the crossover possibilities of conductor track structures and at the same time to avoid cost-intensive additional patterned metal layers using photolithographic technology which require a considerable additional fabrication outlay.

Both the jet-printed external conductor tracks and jet-printed conductor tracks on a semiconductor chip differ significantly from laminated, coated or electrodeposited materials in terms of their microstructure. Metal layers which provide metallic conductor tracks produced by sputtering technology or metal vapor deposition technology and by chemical deposition also differ significantly in terms of their microstructure from the jet-printed conductor tracks used here, since the jet printing ink used for this does not comprise sputtered or liquid metals, but rather has finely distributed metal particles that are held by an evaporable binder in the jet liquid. Consequently, these conductor tracks principally comprise agglomerates of metal particles and are fixed by an adhesion promoter—likewise present in the liquid—on the plastic housing composition to be insulated of the external areas of a semiconductor device housing or on the insulating passivation layer of an active top side of a semiconductor chip. After the evaporation of the binder and after the evaporation of corresponding solvents for the adhesion promoter, the metal particles are held together in contact-making fashion in close contact under the action of "van der Waals'" binding forces. As an alternative, the ink may have metal ions of salts that are correspondingly dissolved in the liquid.

A further aspect of the invention relates to a semiconductor module comprising a lower semiconductor base device made of a semiconductor device according to the above embodiments and an electronic device stacked thereon. This stacked electronic device has surface-mountable connections to which the external contact areas on the top side of the semiconductor device are adapted. The advantageous possibility of providing jet-printed conductor tracks and jet-printed external contact areas as a first wiring layer on top sides of a semiconductor device housing enables the designer to accommodate different electronic devices in stacked fashion on the semiconductor base device for a wide variety of modular arrangements. In this case, the stacked electronic device may be a passive discrete circuit element such as a resistor, a capacitor or an inductance. For this purpose, the circuit elements advantageously have surface-mountable electrodes which can be arranged on the correspondingly provided external contact areas of the semiconductor device according to the invention on the top side of the housing.

Instead of discrete passive circuit elements, semiconductor devices having surface-mountable external contacts may also be fixed on the top side of the device housing if the arrangement of the external contact areas on the top side of the semiconductor device housing is adapted to the arrangement of the external contacts of the semiconductor device to be stacked. Furthermore, it is possible also to apply semiconductor chips on the top side of the semiconductor device according to the invention, which semiconductor chips can then be connected by means of bonding connections to the corresponding external contact areas on the top side of the semiconductor device housing. Consequently, the sole requirement that a device component to be stacked has to have is that it has surface-mountable electrodes or external contacts to which the structure of the conductor tracks or of the external contact areas on the top side of the semiconductor device according to the invention can be adapted.

In a preferred further embodiment of the invention, the semiconductor module comprises at least one logic device, preferably an MPCP (microprocessor chip package), and/or a memory device, preferably a DRAM (dynamic random access memory) and/or a GDRAM (graphic dynamic random access memory). Such semiconductor devices using BGA technology or LBGA technology have the advantage that extremely compact and space-saving memory modules can be provided.

A method for producing a semiconductor device having a plastic housing, which comprises external conductor tracks by means of which lower and upper external contact areas are electrically connected, includes the following process. A semiconductor device is produced having a plastic housing and having lower external contact areas as external connections on the underside of the housing, which are connected to contact pads on edge sides of the housing by means of internal conductor track structures. This is followed by application of upper external contact areas and external conductor tracks for connecting the upper external contact areas to the lower external contact areas by means of the contact pads by means of jet printing as a first conductor track layer.

This method has the advantage that, by means of a relatively inexpensive technique, it is possible subsequently, that is to say after completion of a semiconductor device with housing, external areas and external contacts already situated on the underside with a wiring structure, to provide the top side and the edge sides of the semiconductor device with external conductor tracks and upper external contact areas. In one embodiment, a jet printing process is used for this purpose, during which the structure of the conductor tracks and of the upper external contact areas can be printed or written as a first conductor track layer in the manner that is otherwise known from inkjet printers. The conductive ink with which a correspondingly modified jet printing head is supplied has, besides conductive particles, binders and solvents and adhesion agents which form a liquid whose viscosity is coordinated with the dimensions of jet printing nozzles.

Furthermore, the method has the advantage that, by means of suitable pivotable or rotatable jet printing heads, edge sides of the semiconductor device housing that run vertically with respect to the top side can also have conductor tracks printed on them. Rigid jet printing heads can print on edge sides at least up to an angle of 60° with respect to the underside of the semiconductor device without difficulties. It is only at greater angles, and in particular at angles which approach the 90° limit, that is to say the perpendicular, for the edge sides, that it becomes necessary to pivot the jet printing head by a few degrees in order to successfully implement a precise image or a precise patterning of the conductor tracks on the edge sides.

While the binder and/or the solvent of the jet printing liquid largely evaporates, the adhesion agent contained in the jet printing liquid adheres on the top side of the device housing and ensures that conductive particles in part of nanometer size, in densely packed fashion, form a first conductor track layer and make contact with one another on account of "van der Waals'" binding forces in such a way that a current flow becomes possible.

In one preferred implementation of the method, the first conductor track layer is reinforced by application of a metal layer. The properties of such a reinforcing metal layer may be coordinated with external contacts of electronic devices to be stacked.

If the reinforcing metal layer is intended to improve the conductivity of the conductor tracks, then a metal layer made of copper or a copper alloy is deposited by electrodeposition or preferably in electroless fashion on the first jet-printed conductor track layer for reinforcement purposes. Further layers for the solderability and/or bondability are deposited, if appropriate.

For external contact areas on the top side which are intended to be connected to corresponding electronic devices or semiconductor chips by means of bonding wires, the topmost metal layer is coordinated with the bonding wire material, in such a way that the materials of external contact areas and bonding wire preferably form a stable intermetallic phase at low process temperatures. The electroless or chemical deposition of a metal layer has the advantage that metal is added only when metallic seeds, such as the first conductor track layer, are also situated, so that the common connection—necessary for electrodeposition—of all the structures and the subsequent separation thereof e.g. by photolithographic patterning can be obviated.

A further method possibility consists in producing the first conductor track layer by large-area jet printing with subsequent patterning. In this case, the entire surface to be provided with a first conductor track layer is metalized with the aid of the jet printing method and is subsequently patterned by means of photolithography or by means of laser removal technology.

A further method possibility consists in the first conductor track layer being able to be effected over the whole area by dipping into the electrically conductive ink. In this case, the wetting of the surface and primarily the penetration of the ink into the plated-through holes can be considerably improved by e.g., ultrasound. This gives rise to a "seed layer" which cleanly wets even the surface of extremely deep and steep holes (plated-through holes) even with undercuts, in contrast to sputtering or vapor deposition technology. Undercuts are unavoidable in the case of laser-drilled vias in molding compositions with filling grains of e.g. larger than 5 micrometers. The conductor tracks may subsequently be patterned by means of photolithography or laser removal technology.

A further aspect of the method relates to the production of a semiconductor device having a semiconductor chip, which has jet-printed conductor tracks. For this purpose, firstly a semiconductor wafer having a plurality of semiconductor chip positions is produced. Insulation layers and metal layers are then printed onto the topmost wiring structure of the integrated circuit of said semiconductor wafer by means of jet printing with formation of bridge structures at crossover positions of conductor track layers. Afterward, the semiconductor wafer can be separated into individual semiconductor chips and the semiconductor chips can be incorporated into corresponding semiconductor devices.

This aspect of the invention uses the jet printing method in order to subsequently apply a multiplicity of "shunts" on a semiconductor chip or on a semiconductor wafer in an inexpensive manner in order thereby to provide crossover points or to interconnect, to branch, to activate and/or to deactivate function blocks of the integrated circuit. This method according to the invention is advantageous particularly when only few bridges are required in order to improve the functionality of the integrated circuit. In contrast to standardized photolithography and metalization methods, the variant according to the invention results in an improvement in the properties of the "shunts" since a conductor track of virtually arbitrary thickness can be applied by means of the jet printing process. Moreover, there is the possibility of further reinforcing the bridge structure by means of an additional metal layer made of a solder material or made of an electrodeposited material.

In one embodiment of the invention, in order to form bridge structures, firstly insulation structures are applied to the underlying conductor tracks which are to be bridged. The bridges made of conductor tracks are subsequently laid over said insulation structures by means of jet printing.

A further aspect of the invention relates to a method for producing a semiconductor module having the following process. A semiconductor device is produced according to the methods presented above, which semiconductor device is produced as a semiconductor base device with arrangement of upper external contact areas for receiving an electronic device to be stacked. An electronic device to be stacked is subsequently applied with connection of external connections of the electronic device to be stacked to the upper external contact areas of the semiconductor base device.

This method variant gives rise to a semiconductor module which comprises electronic devices stacked one above another, it being possible for the stacked electronic devices also to have passive circuit elements which, however, are equipped with surface-mountable electrodes. This method has the advantage that it is extremely flexible and can connect a large range of module components to one another in stacked fashion, the connecting technique being based on external jet-printed conductor tracks, which constitutes an improvement in terms of fabrication technology and also a reduction in the costs of the semiconductor modules.

To summarize, it can be established that the present invention employs a consistent application of electrically conductive inks in the area of packaging by means of jet printing technology or dipping with, if necessary, subsequent metalization and patterning. It is thus possible to produce semiconductor base devices including a functional testing before they are processed with other semiconductor devices to form semiconductor modules. With this technology it is possible to produce passage openings through the plastic of the housing to a wiring substrate by means of conductive liquid for filling the openings. The following advantages can be attained in this case.

1. As a result of the low viscosity of the liquid and as a result of setting the surface tension by means of corresponding additives in the liquid, even extremely small and steep passages having a high aspect ratio and even undercuts can easily be filled or wetted laterally sufficiently well, which is practically impossible in conventional sputtering processes. It is thus possible to produce plated-through holes in the panel of n×m devices which are separated at the end of the process chain by e.g., sawing.
2. Given approximately perpendicular walls of the housing edges, a corresponding jet printing head or the semiconductor device itself can be correspondingly pivoted, so that the liquid jet impinges from an acceptable angle on the surfaces to be printed.
3. As a result of the serial writing or printing, it is possible to compensate for individual offsets of the substrate tolerances among one another by means of "pattern recognition".
4. If necessary, the liquid-applied seed layers can be reinforced chemically or galvanically with the corresponding layer sequences, such as Cu—Ni—Au, for example. Conceivable other metalization sequences are likewise possible, such as, for example, a solder alloy as topmost reinforcing metal layer.
5. Thermal method processes, insofar as they do not damage the plastic housing composition, may likewise be used in order to improve the adhesion of the first jet-printed conductor track layer.
6. Bridges over existing conductor tracks on the top side of the housing can also be realized if the conductor tracks are covered with an insulation layer beforehand.
7. The abovementioned soldering resist may likewise be applied by means of a jet printing technique, which is particularly economic when the soldering resist is used for delimiting or surrounding external contact areas.

The jet printing method with a conductive liquid can be used particularly advantageously at the wafer level or at the panel level, as is known from the "universal package" technique. In the former case, a multiplicity of semiconductor chip positions on a semiconductor wafer can thus be provided with corresponding conductor track structures, while in the case of a panel a multiplicity of semiconductor devices can be provided with such external conductor track structures on their top side. This is particularly economic if only relatively few conductor tracks are to be produced. This affords the advantages below if the following preconditions are met:

1. that contact areas whose layer construction has a diffusion barrier are already present on the semiconductor wafer; and
2. if it is possible to effect application of a dielectric and lithographic processing of the dielectric with the opening of contact areas by means of a laser;

then a laser removal method has the advantage that it is possible to react to geometrical "offsets" for each individual chip with the aid of a "pattern recognition".

3. If jet printing with an electrically conductive liquid is effected and a reinforcement of these conductor tracks can possibly also be carried out in addition;

then it is advantageously possible to produce corresponding bridges as crossover points for conductor tracks on a semiconductor chip or a panel, which can subsequently be protected by application and patterning of a soldering resist.

A type of negative patterning is also possible in that firstly the electrically conductive liquid is applied over the whole area by means of dipping or jet printing and the area is subsequently patterned by means of laser removal or a typical lithography process. It is likewise possible to effect a "lift-off process" for patterning a previously applied whole-area coating made of conductive liquid. It may thus be possible, by introducing a photolithography step, to achieve significantly finer structures than can be achieved in the case of direct jet printing.

Furthermore, the laser removal is a very fast method which possibly enables shorter fabrication times in terms of its fabrication speed compared with a jet printing writing process. Consequently, the invention's method of jet printing of a conductive material is predestined both for small structure widths and for large ground pads and enables an inexpensive additional wiring plane if, by way of example, only few bridges are required. This is advantageous in particular when it emerges that the wiring planes provided do not suffice for the integrated circuit in order to provide sufficient bridges or bridging circuits.

Before further wiring planes are designed which are significantly more complicated and considerably more expensive to produce using known technologies, the formation of conductor tracks by jet printing according to the invention enables a simple, but inexpensive extension of the technology of integrated circuits. In order to produce bridges, the insulation structure which is required for insulating the bridge material from the underlying conductor tracks may also be applied by means of jet printing technology. However, the liquid must then be electrically insulating. The method according to the invention with conductive liquid also enables the replacement of sputtered "seed layers" which are used for corresponding galvanic reinforcement processes.

FIG. 1 illustrates a schematic cross section through a semiconductor device 1 of a first embodiment of the invention. The semiconductor device 1 has a semiconductor chip 20, which has flip-chip contacts 42 on its active top side 23. Said flip-chip contacts 42 are arranged on a top side 43 of a wiring substrate 44, the wiring substrate 44 having through contacts 46 from the top side 43 to the underside 45, which are only depicted schematically here and normally do not lie directly below the flip-chip contact 42 and above the external contacts 13. In this schematic illustration, the flip-chip contacts 42 of the semiconductor chip 20 are arranged on the through contacts 46 and connected to contact pads 37 on the top side 43 of the wiring substrate 44 by means of internal conductor track structures 36 and 52 of the wiring substrate 44. Moreover, the through contacts 46 form, on the underside 45 of the wiring substrate 44, lower external contact areas 13, which are illustrated here as a land grid without balls. Finally, the underside 45 of the wiring substrate 44 is simultaneously the underside 10 of the semiconductor device 1. By virtue of the internal conductor track structures 36, 52 of the wiring substrate 44, the chip contacts 42 of the semiconductor device 1 can be arranged in a manner distributed arbitrarily on the underside 10 of the semiconductor device 1.

The semiconductor chip 20 with its flip-chip contacts 42 is embedded in a plastic housing 6. In this case, the plastic of the housing 6 forms a planar top side 9 and edge sides 11 and 12 arranged at an angle α with respect to the underside 10 of the semiconductor device 1. The semiconductor device 1 not only has external contact areas 13 as external connections 7 on its underside 10, but also has corresponding upper external contact areas 14 as external connections 7 on the top side 9. Said upper external contact areas 14 are arranged over external conductor tracks 15 that follow the housing external contour 8. In the cross-sectional view of FIG. 1, the external conductor tracks 15 are connected in the form of a first jet-printed conductor track layer 16 to contact pads 37 on the top side 43 of the wiring substrate 44. By means of the internal conductor track structures 36, 52 in the wiring substrate 44, the external conductor tracks 15 are thus electrically connected to chip connections 42 and/or lower external contact areas 13 on the underside 45.

A device of this type has the advantage that the entire top side 9 is available for fitting upper external contact areas 14 with external connections 7, which are depicted schematically without soldering resist here, and thus for fitting additional electronic devices on said top side 9. It is thus possible to connect on this semiconductor device 1 surface-mountable electronic devices in the form of passive circuit elements or active semiconductor devices. The first conductor track layer 16 made of jet-printed electrically conductive material may already suffice to produce a sufficiently low-impedance connection between the upper external contact areas 14 and the lower contact pads 37. However, it is also possible further to reinforce these external conductor tracks 15 by means of additional metal layers and to increase their conductivity or to reduce their resistance. It is furthermore possible to realize conductor track crossovers (not illustrated here) analogously to FIG. 3.

Figure 2:
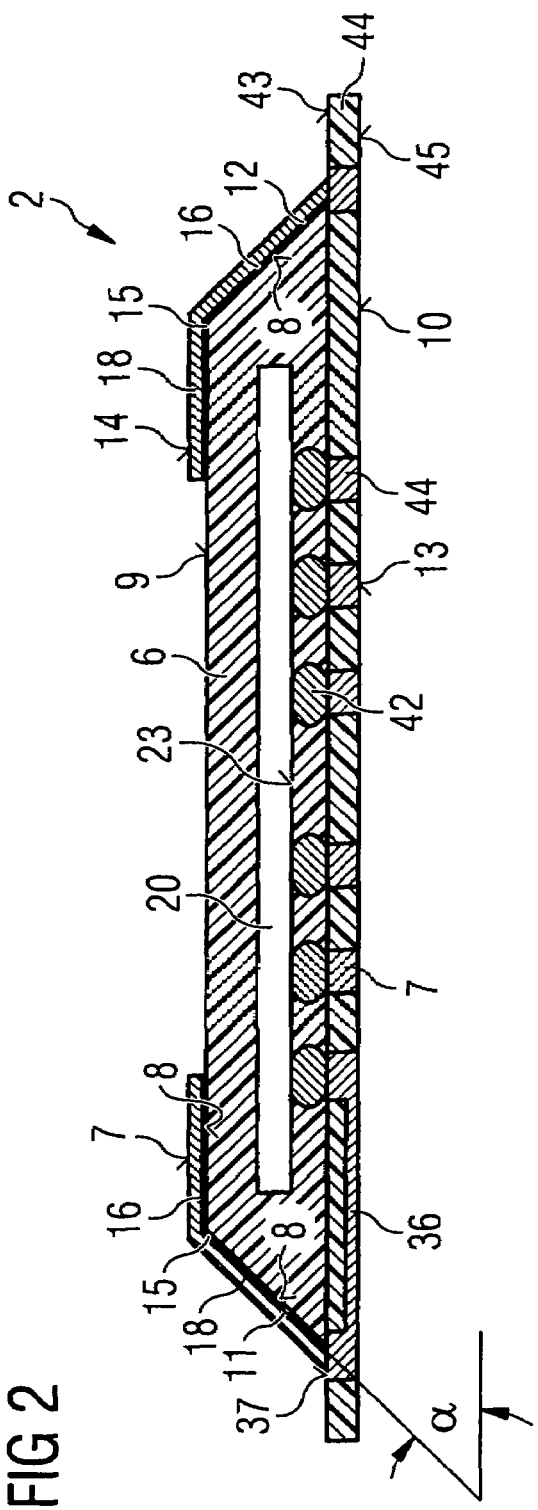
FIG. 2 illustrates a schematic cross section through a semiconductor device of a second embodiment of the invention.

FIG. 2 illustrates a schematic cross section through a semiconductor device 2 of a second embodiment of the invention. Components having functions identical to those in FIG. 1 are identified by the same reference symbols and are not discussed separately. The advantages of such a semiconductor device 2 have already been discussed in detail above and are omitted at this juncture in order to avoid repetition.

The embodiment of FIG. 2 differs from the embodiment in accordance with FIG. 1 by virtue of the fact that the first conductor track layer 16 has now been reinforced by means of at least one further metal layer 18. Said metal layer 18 may on the one hand have metal layers that facilitate bonding in the region of the upper external contact areas 14 or enable soldering onto the external connections 7 of the upper external contact areas 14. Moreover, they may contribute to reducing the conductor track resistance by the use of copper or copper alloys as material of the additional metal layer 18. The topmost metal layers may additionally have a copper-diffusion-inhibiting layer made of nickel and above that a noble metal layer in order to improve the connection or bonding to external contacts of a semiconductor device to be stacked or of an electronic circuit element. Typical noble metal layers are Au and/or Pd.

A noble metal layer made of gold is used when, by way of example, the external contacts to be connected of the electronic devices to be stacked have aluminum. Conversely, the topmost metal layer may be aluminum if the electrodes of the electronic circuit elements to be stacked have gold-plated electrodes. Finally, it is also possible to provide a solder coating instead of the noble metal coating or the aluminum metal coating in order that semiconductor devices to be stacked or passive electronic circuit elements can be soldered onto the external contacts 7 of the upper external contact areas 14. This embodiment of the invention has the advantage in any case that not only are lower external contact areas 13 made available on the underside 10 of the semiconductor device 2, but that metal-layer-reinforced upper external contact areas 14 are also available on the top side 9 of the semiconductor device 2.

Figure 3:
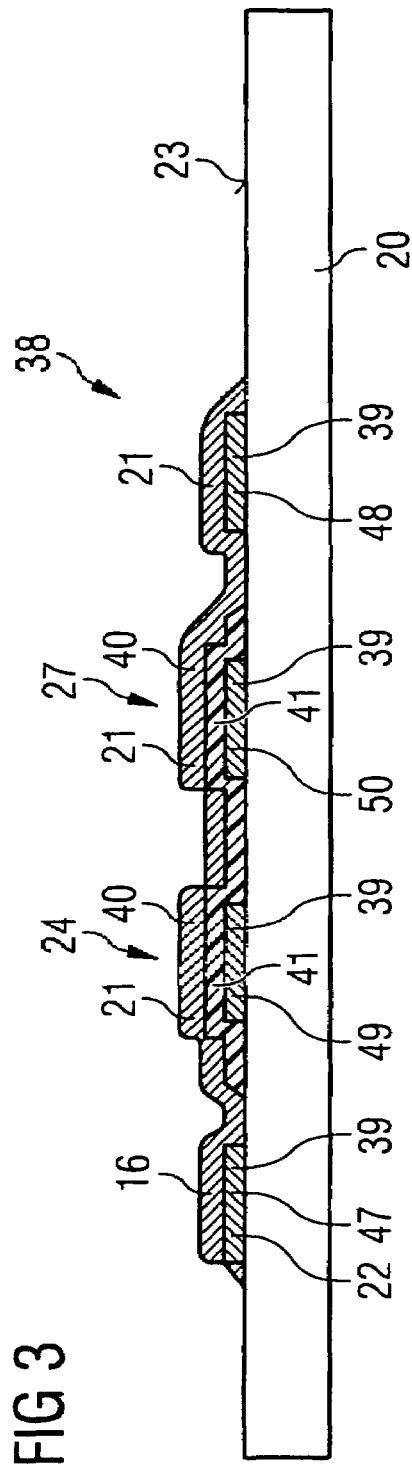
FIG. 3 illustrates a schematic cross section through a semiconductor chip in accordance with a further aspect of the invention.

FIG. 3 illustrates a schematic cross section through a semiconductor chip 20 in accordance with a further aspect of the invention with a crossover position 38 of conductor tracks 21 and 49 and 50, respectively, of a topmost wiring structure of a semiconductor chip 20. Such a semiconductor chip 20 can be incorporated into a semiconductor device such as is shown in FIG. 1 and FIG. 2. The particular feature of this semiconductor chip 20 is that the possibilities for the wiring of the active top side 23 of the semiconductor chip 20 can be improved by means of few inexpensive fabrication processes.

This improvement can be seen in the fact that a conductor track layer 39 that is provided and is arranged on the active top side 23 of the semiconductor chip 20 is bridged by a jet-printed conductor track layer 40 by firstly applying a jet-printed insulation structure 41 to the conductor tracks 49 and 50, respectively, of the conductor track layer 39 of the semiconductor chip 20. The additional jet-printed conductor track layer 40 is then applied and connects the conductor tracks 47 and 48 of the conductor track layer 39 as desired directly on the top side 23 of the semiconductor chip 20 without forming short circuits with the conductor tracks 49 and 50, respectively.

Such a semiconductor chip 20 can be produced particularly inexpensively when only few bridges 24 or 27 of this type are required on a semiconductor chip 20, especially as the application of a conventional further metalization with a photolithographically patterned conductor track layer is extremely cost-intensive. The application of a controlled jet printing for forming the insulation structure 41 and the conductor track layer 40 is very inexpensive, by contrast.

Such bridges can be produced in the same way on the top side 9 of the device 2 in FIG. 1 or FIG. 2.

Figure 4A:
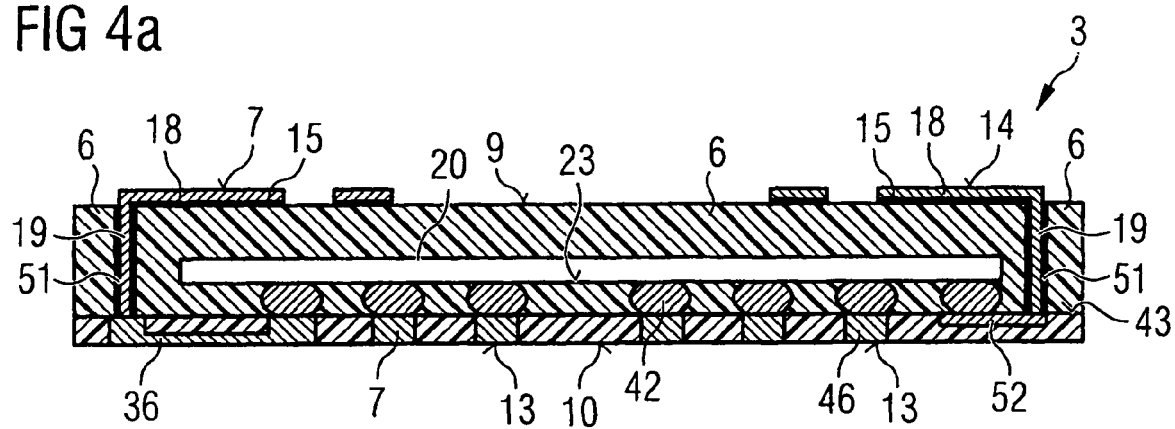
FIG. 4a illustrates a schematic cross section through a semiconductor device of a third embodiment of the invention.

FIG. 4a illustrates a schematic cross section through a semiconductor device 3 of a third embodiment of the invention. Components having functions identical to those in the previous figures are identified by the same reference symbols and are not discussed separately. FIG. 4a illustrates a plastic housing 6 with perpendicular edges. The perpendicular edges result from singulation of the devices from a map-molded panel by means of sawing.

The third embodiment of the invention in accordance with FIG. 4 differs from the previous embodiments in accordance with FIGS. 1 and 2 by virtue of the fact that the plastics composition of the plastic housing 6 is used in an edge region in which no semiconductor chip 20 covers the wiring substrate 44 in order to provide there a passage opening 51 for a through contact 19 through the plastic of the plastic housing 6, the through contact 19 comprising jet-printed conductive material. The latter is possible in that, given corresponding viscosity of the conductive jet printing liquid, the entire passage opening 51 is filled with liquid and the volatile constituents of the binder and of the solvent that are contained in the liquid are subsequently evaporated in a thermal process. If the passage opening 51 is not completely filled by the jet-printed electrically conductive material, then the subsequently applied metal layer 18 can also fill said through contact 19. For sufficient through-plating it often suffices, however, for the side walls of the passage opening 19 to be metalized. Said through contact 19 is electrically connected to a lower external contact area 13 and a chip contact 42 by means of an internal conductor track structure 36 and 52 on the top side 43 of the wiring substrate 44.

FIG. 4a illustrates a flip-chip version. Of course, a wire-bonded chip can be processed in the same way. A combination of FIGS. 4 and 1 and 2, respectively, and a crossover of conductor tracks on the top side 9 according to FIG. 3 are furthermore possible. In one process variant, the wiring substrate 44 is protected with resist over the whole area on the underside 45. After the fabrication of the passage opening 51 (via), the entire device is treated hydrophobically and then placed into an electrically conductive ink. The wetting and the penetration of the ink into the passage opening are supported by ultrasound, so that a good seed layer is provided after drying.

Figure 4B:
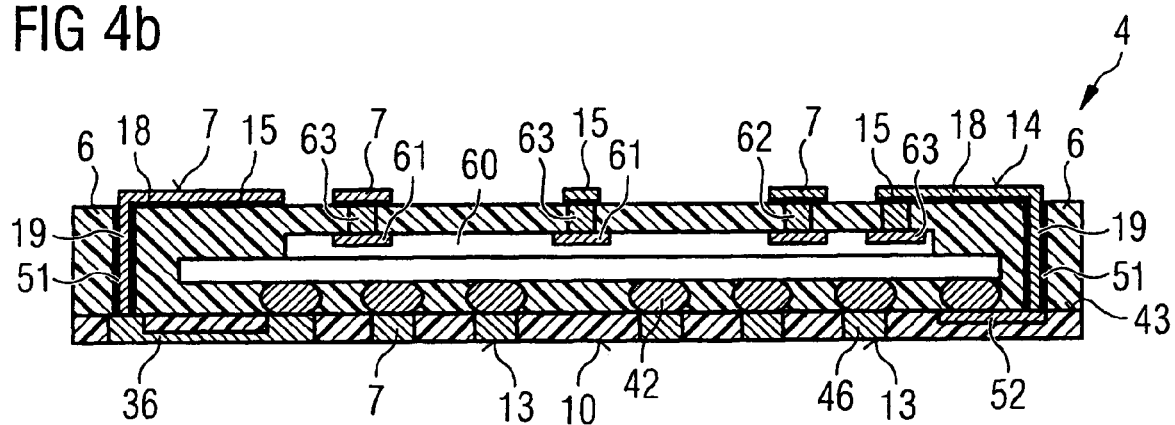
FIG. 4b illustrates a schematic cross section through an extended third embodiment of the invention.

FIG. 4b illustrates an extension of the embodiment in accordance with FIG. 4a. Here the housing 6 contains a further chip 60 having contact areas 61. The passage openings 62 and through contacts are produced analogously to the passage openings 51 and through contacts 19 as described in FIG. 4a. The contact areas 61 preferably have a thicker metalization analogously to a customary rewiring layer.

Figure 5A:
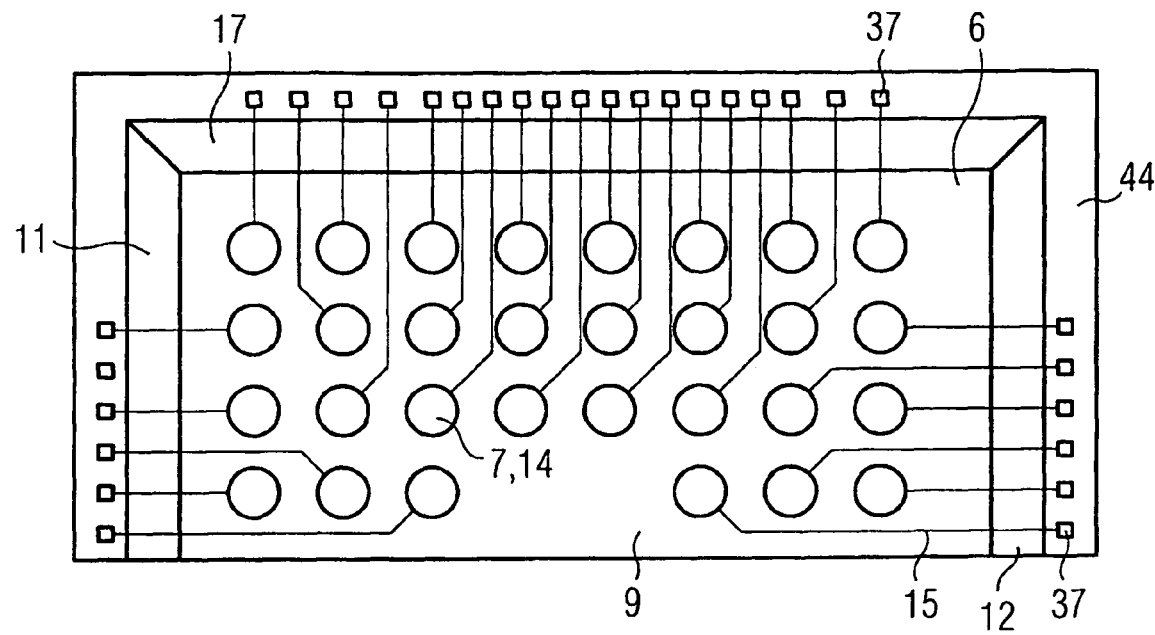
FIG. 5a illustrates a schematic plan view of the semiconductor device in accordance with FIG. 4.

FIG. 5a illustrates a schematic plan view of a semiconductor device 2 of FIG. 2. The plan view illustrates only half of a semiconductor device. This plan view shows that the edge sides 11, 12 and 17 are slightly beveled and, on said edge sides 11, 12 and 17, the external conductor tracks 15 extend from the external connections 7 of the upper external contact area 14 on the top side 9 of the semiconductor device 2 to the contact pads 37 on the top side 43 of the wiring substrate 44. Possible crossovers according to FIG. 3 are not illustrated. The upper contact area 14 with the external connections 7 is illustrated here for a BGA structure (ball grid array). A soldering resist at the external connections 7 is not illustrated.

Figure 5B:
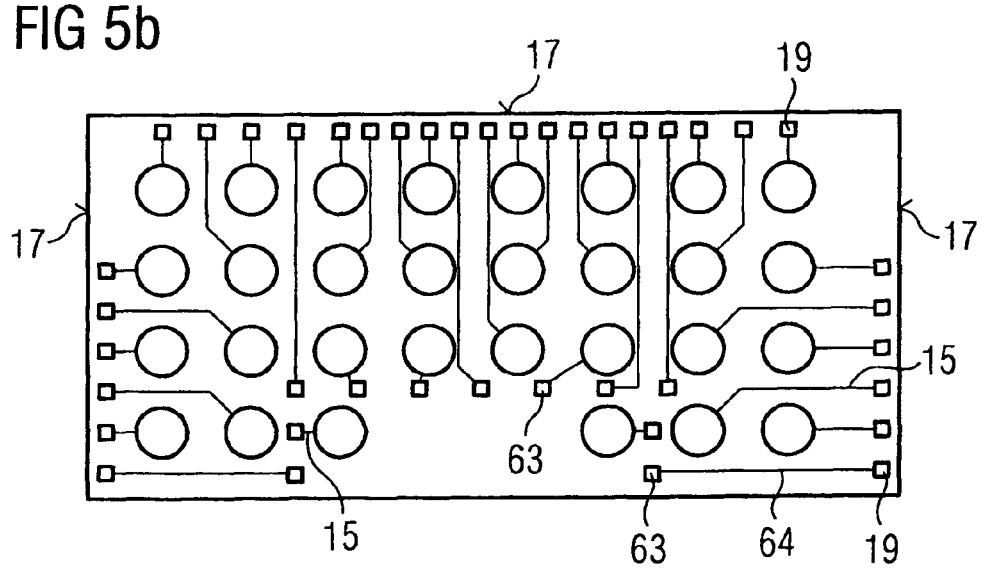
FIG. 5b illustrates a further schematic plan view of the semiconductor device in accordance with FIG. 4.

FIG. 5b illustrates, analogously to FIG. 5a, a schematic plan view of a semiconductor device 3 of FIG. 4. This plan view shows that the external conductor tracks 15 extend from the external connections of the upper contact areas 14 on the top side of the semiconductor device 3 to the through contacts 19 and 63. An internal electrical connection 64 from through contacts 19 to through contacts 63 is furthermore illustrated.

Moreover, the position of the through contact 19 through the plastic of the plastic housing 6 is shown, by means of which there is a further possibility of connecting the upper external contact areas 14 to lower external contact areas (not shown here) by means of internal wiring lines. Said through contact 19 is connected to one of the through contacts of the wiring substrate 44 by means of an internal conductor track structure on the top side 43 of the wiring substrate 44.

FIG. 6 illustrates a schematic cross section through a semiconductor module 4 in accordance with a fourth embodiment of the invention. The semiconductor module 4 has a lower semiconductor base device 30 formed by a semiconductor device 2 of the second embodiment of the invention. Components having functions identical to those in FIG. 2 are identified by the same reference symbols and are not discussed separately.

On the external connections 7 on the top side 9 of the semiconductor base device 30, external contacts 34 of the stacked semiconductor device 33 are arranged on upper external contact areas 14. Said stacked semiconductor device 33 has a semiconductor chip 25, from the active top side 28 of which bonding wires 53 lead to a wiring substrate 54 of the stacked semiconductor device 33, through contacts 55 through the wiring substrate 54 producing the electrical connection to the upper external contact areas 14 of the semiconductor base device 30. In this embodiment of a semiconductor module 4, the latter includes a memory device and a microprocessor, the stacked semiconductor chip 25 of the microprocessor being embedded with its bonding wires 53 in a plastic housing composition 56.

FIG. 7 illustrates a schematic cross section through a semiconductor module 5 in accordance with a fifth embodiment of the invention. The fifth embodiment of the invention has a semiconductor device 2 of the second embodiment of the invention as a semiconductor base device 30 of the semiconductor module 5. On the top side 9 of the housing, said semiconductor device 2 bears a semiconductor chip 26 and a passive electronic circuit element 32, which is surface-mounted by its electrodes 59 on upper external contact areas 14. The semiconductor chip 26 is connected by means of bonding connections 35 to the upper external contact areas 14 of the semiconductor base device 30 and furthermore has a large-area contact of its rear side 58, which contact is fixed on a correspondingly sized upper external contact area 14.

On its active top side 29, the semiconductor chip 26 has contact areas 57 which are connected by means of bonding connections 35 to upper external contact areas 14 of the semiconductor base device 30. By means of a further bonding connection 35, the semiconductor chip 26 is electrically connected to the passive electronic circuit element 32 by means of external conductor tracks 15 on the top side 9 of the semiconductor base device 30 with one of the electrodes 59 of the circuit element 32. Consequently, the cross section through this semiconductor module 5 shows that a flexibly configurable interconnection of module components is possible on the top side 9 of the semiconductor base device 30 by means of the external conductor tracks 15 and the upper external contact areas 14.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or 10 variations of the specific embodiments discussed herein. Therefore, it is intended that this invention be limited only by the claims and the equivalents thereof.

What is claimed is:

1. A method for producing a semiconductor device having a plastic housing, which comprises through contacts by which lower and upper external contact areas, or contact areas of a semiconductor chip are electrically connected, the method comprising:
    producing a semiconductor device having a plastic housing and having lower external contact areas on the underside of the plastic housing, which are connected to contact pads internally within the plastic housing by internal conductor track structures;
    introducing contact openings into the plastic housing composition with uncovering of the internal contact pads and/or of internal contact areas of a semiconductor chip, the internal contact pads being electrically connected to the lower external contact areas; and
    applying upper external contact areas and external conductor tracks for connecting the upper external contact areas by means of the contact openings to the contact pads or the contact areas by means of jet printing or by means of subtractive methods, with the contact openings simultaneously being filled with conductive material with formation of through contacts to the internal contact pads or to the contact areas.

2. The method according to claim 1, wherein the first conductor track layer is reinforced by application of one or a plurality of metal layers.

3. The method according to one of claim 1, wherein for the reinforcement of the first conductor track layer, solder deposits are applied on the upper external contact areas and are liquefied, and liquid solder material propagates and wets the first conductor track layer.

4. The method according to claim 1, wherein the first conductor track layer is reinforced by electrodeposition of a metal layer.

5. The method according to claim 1, wherein the first conductor track layer is reinforced by electroless deposition of a metal layer.

6. The method according to claim 1, wherein the first conductor track layer is produced by large-area jet printing or dipping and subsequent patterning.

7. A method for producing a semiconductor device having a semiconductor chip comprising:
    defining the semiconductor chip to comprise jet-printed conductor tracks:
    producing a semiconductor wafer having a plurality of semiconductor chip positions;
    applying a topmost wiring structure to the semiconductor wafer by means of jet printing with formation of bridge structures at crossover positions of conductor track layers in the semiconductor chip positions;
    separating the semiconductor wafer into individual semiconductor chips;
    incorporating one of the semiconductor chips into a semiconductor device.

8. The method according to claim 7, wherein insulation structures are applied prior to the application of the topmost wiring structure for the formation of bridge structures, to which insulation structures the bridges made of conductor tracks are subsequently applied by means of jet printing.

9. A method for producing a semiconductor module, comprising:
    producing a semiconductor device according to claim 1 as a semiconductor base device with arrangement of the upper external contact areas for receiving an electronic device to be stacked; and
    applying a stacked electronic device with connection of external contacts of the electronic device to be stacked to the upper external contact areas of the semiconductor base device.

10. The method according to claim 1, wherein the upper external contact areas and the external conductor tracks are applied by means of dipping for the production of a seed layer and subsequent reinforcement of the seed layer by electrodeposition or chemical deposition and subsequent patterning of the layer formed.

* * * * *